(12) United States Patent
Sacca et al.

(10) Patent No.: US 6,584,196 B1
(45) Date of Patent: Jun. 24, 2003

(54) ELECTRONIC INDUCTOR WITH TRANSMIT SIGNAL TELEPHONE LINE DRIVER

(75) Inventors: Frank Sacca, Diamond Bar, CA (US); Raphael Rahamim, Orange, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/312,136

(22) Filed: May 14, 1999

(51) Int. Cl.[7] .......................... H04M 9/00; H04M 1/00; H04M 11/00; H03F 3/04
(52) U.S. Cl. .............. 379/405; 379/399.01; 379/93.05; 379/402; 379/377; 379/398; 379/410; 379/412; 379/442; 379/443; 330/305
(58) Field of Search ................................ 327/304, 300, 327/291; 379/93.29, 93.05, 399, 412, 410, 405; 375/219, 222, 257; 330/305, 116

(56) References Cited

U.S. PATENT DOCUMENTS

| | | | |
|---|---|---|---|
| 3,872,391 A | * | 3/1975 | Dalley |
| 4,214,130 A | | 7/1980 | Questad |
| 4,437,147 A | | 3/1984 | Carpenter .................... 363/21 |
| 4,465,903 A | * | 8/1984 | Barber |
| 4,514,704 A | * | 4/1985 | Curtis |
| 4,528,424 A | | 7/1985 | Middleton et al. |
| 4,607,140 A | | 8/1986 | Schorr |
| 4,607,141 A | | 8/1986 | Schorr |
| 4,623,799 A | | 11/1986 | Nyman, Jr. ................. 307/260 |
| 5,349,638 A | | 9/1994 | Pitroda et al. |
| 5,351,289 A | | 9/1994 | Logsdon et al. |
| 5,361,296 A | | 11/1994 | Reyes et al. |
| 5,369,666 A | | 11/1994 | Folwell et al. |
| 5,465,298 A | * | 11/1995 | Wilkinson et al. |
| 5,473,552 A | | 12/1995 | Chen et al. |
| 5,544,241 A | | 8/1996 | Dibner et al. |
| 5,546,448 A | | 8/1996 | Caswell et al. |
| 5,655,009 A | * | 8/1997 | Arai et al. ................ 379/93.28 |
| 5,675,640 A | | 10/1997 | Tappert et al. |
| 5,734,703 A | * | 3/1998 | Hiyoshi ....................... 379/98 |
| 5,764,694 A | | 6/1998 | Rahamim et al. |
| 5,771,281 A | | 6/1998 | Batten, Jr. |
| 5,781,621 A | | 7/1998 | Lim et al. |
| 5,790,656 A | | 8/1998 | Rahamim et al. |
| 5,796,815 A | | 8/1998 | Guercio et al. |
| 5,799,060 A | | 8/1998 | Kennedy et al. |
| 6,081,586 A | * | 6/2000 | Rahamim et al. ........ 379/93.29 |

FOREIGN PATENT DOCUMENTS

| | | |
|---|---|---|
| FR | 2403690 | 4/1979 |
| GB | 2117590 A | 10/1983 |

OTHER PUBLICATIONS

Huffman, Jim, "How to Design Your Own Power Supplies"; Popular Electronics, an Electronics Magazine, Jun. 1975; pp. 36–39.

Rosenberg, J. M. (Editor), "Dictionary of Computers, Information Processing, and Telecommunications"; 2nd edition, John Wiley & Sons, 1987; pp. 143–144.

Jung, W. G., "Op–Amp Cook Book", 3rd Edition, Prentice Hall PTR, 1997; chapt. 4 (pp. 199–223), and chap. 5(pp. 225–287).

* cited by examiner

Primary Examiner—Fan Tsang
Assistant Examiner—Ramnandan Singh
(74) Attorney, Agent, or Firm—Farjami & Farjami LLP

(57) ABSTRACT

In an electronic inductor circuit, an operational amplifier drives the base of the electronic inductor transistor, and receives negative feedback from the emitter of the transistor. The transistor and operational amplifier combine to form a voltage-controlled current source (VCCS) with respect to the loop current. A voltage divider connected across the rectified Tip and Ring voltage (or another node of the circuit at an equivalent voltage) provides a DC reference to the positive input of the operational amplifier, so that the line current automatically increases with an increase in line voltage. A capacitor couples the transmit signal driver to the positive input of the operational amplifier. This electronic inductor circuit can be driven using a low voltage supply and provides sufficient linearity for high-speed modem applications.

11 Claims, 3 Drawing Sheets

ELECTRONIC INDUCTOR WITH TRANSMIT SIGNAL TELEPHONE LINE DRIVER

CROSS-REFERENCES TO RELATED APPLICATIONS

This application is related to the following U.S. patent applications: U.S. patent application Ser. No. 09/212,707, entitled TELEPHONE LINE INTERFACE CIRCUIT WITHOUT HOOKSWITCH, filed Dec. 16, 1998; U.S. patent application Ser. No. 09/312,218, entitled, TELEPHONE LINE INTERFACE CIRCUIT WITH VIRTUAL IMPEDANCE, filed May 14, 1999. All applications are commonly assigned to the assignee of the present application, and the disclosure of each are herein explicitly incorporated by reference.

BACKGROUND OF THE INVENTION

1. Field of the Invention

The present invention relates generally to the field of modem circuits, and more particularly, to an electronic inductor circuit suitable for use in the interface circuit of a high-speed modem.

2. Description of Related Art

A prior art electronic inductor circuit 10, also known as a gyrator, is illustrated in FIG. 1. An electronic inductor typically consists of a transistor 12 with an emitter resistor Re 14, further biased by a resistor divider 16, 18. The resistor divider 16, 18 is connected across the rectified voltage Tip and Ring lines, and a large capacitor $C_2$ is placed between the base of the transistor 12 and ground to block any AC signals on the telephone line from modulating the collector current of the transistor 12. The electronic inductor is part of the telephone line interface circuit that connects a modem to a telephone line. In this configuration, the electronic inductor determines the DC operating point of the modem or the telephone line without affecting the AC response of the signal transmitted or received.

To transmit a signal into the telephone line, it is customary to superimpose the signal across the Tip and Ring lines by means of a capacitor, transformer, or both. Since the line impedance is 600 ohms, driving the line generally requires a low-impedance signal driver capable of a voltage swing as large as 5 volts peak-to-peak. This swing is difficult to achieve with standard power supplies of 5 volts, and impossible to achieve when using 3 volt power supplies. Other drawbacks to this circuit include the required switch 20, and the large capacitance required for $C_1$.

The voltage swing problem is generally solved by using two differential transmit drivers of one-half the desired swing, one single driver with virtually rail-to-rail output swing, or one single driver with power supply greater than 5 volts. Another approach is to drive the base of the transistor 32 in the electronic inductor 30 with the transmit signal 14, after decoupling the base from the voltage divider 36, 38 with a suitable resistor 10, as shown in FIG. 2. Similar configurations are currently used for telephone answering machines. In the later configuration, however, the non-linear characteristics of the transistor 32 are reflected into the signal transmitted on the line, and the signal lacks the linearity required for high-speed modem applications.

SUMMARY OF THE INVENTION

The present invention is an electronic inductor circuit in which an operational amplifier drives the base of the electronic inductor transistor, and receives negative feedback from the emitter of the transistor. The transistor and operational amplifier combine to form a voltage-controlled current source (VCCS) with respect to loop current. A voltage divider connected across the rectified Tip and Ring voltage (or another node of the circuit at an equivalent voltage) provides a DC reference to the positive input of the operational amplifier, so that the line current automatically increases with an increase in line voltage. A capacitor couples the transmit signal driver to the positive input of the operational amplifier. The voltage feedback to the transistor is generally different for the AC and DC signals, which effectively translates to different AC and DC currents through the loop. A second transistor may also be used to provide increased isolation for the AC modem when the device is on-hook.

In this configuration, the operational amplifier linearizes the voltage signal at the emitter of the transistor (through the negative feedback input), and causes the line current to swing linearly. Specifically, if the collector voltage is sufficiently above Ve, the harmonic content or distortion of the transmitted signal is at least 80 dB below the fundamental signal level.

The present invention may also be configured using a Darlington transistor pair in order to minimize the current required by the operational amplifier driver into the base of the first transistor.

BRIEF DESCRIPTION OF THE DRAWINGS

The exact nature of this invention, as well as its objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor for carrying out the invention. Various modifications, however, will remain readily apparent to those skilled in the art, since the basic principles of the present invention have been defined herein specifically to provide an electronic inductor circuit suitable for high-speed modem applications.

Figure 1:
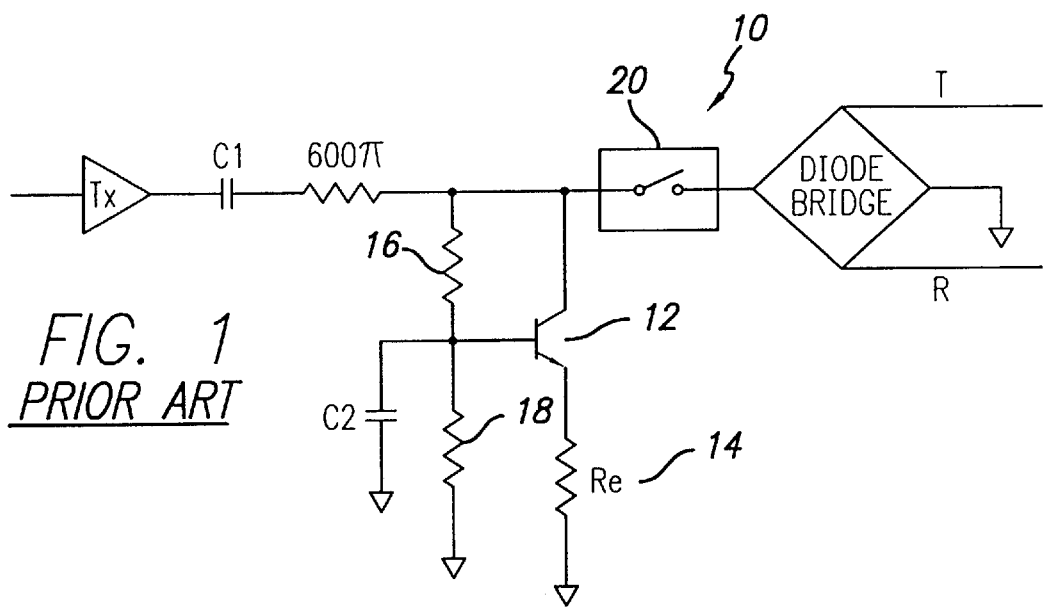
FIG. 1 is schematic diagram of a prior-art electronic inductor circuit.
Figure 2:
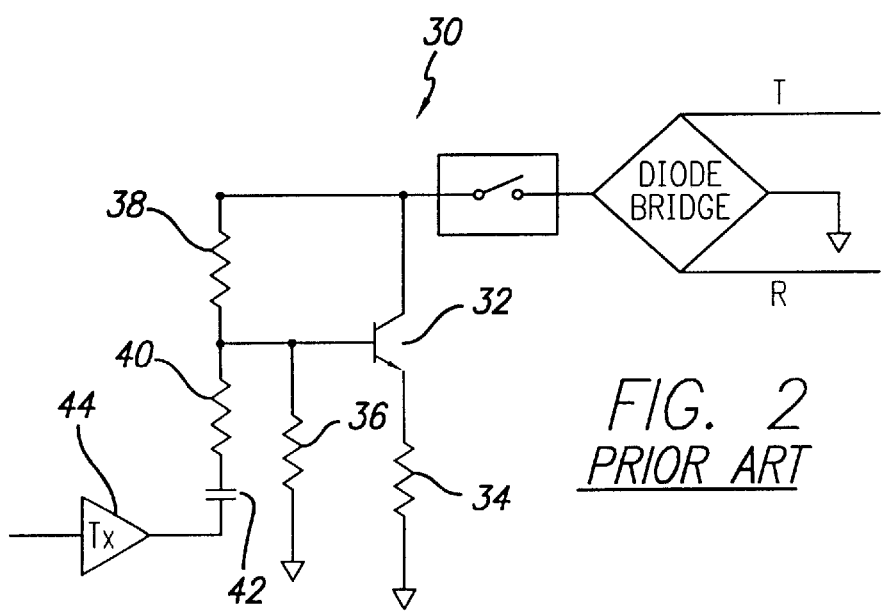
FIG. 2 is a schematic diagram of a second prior-art electronic inductor circuit.
Figure 3:
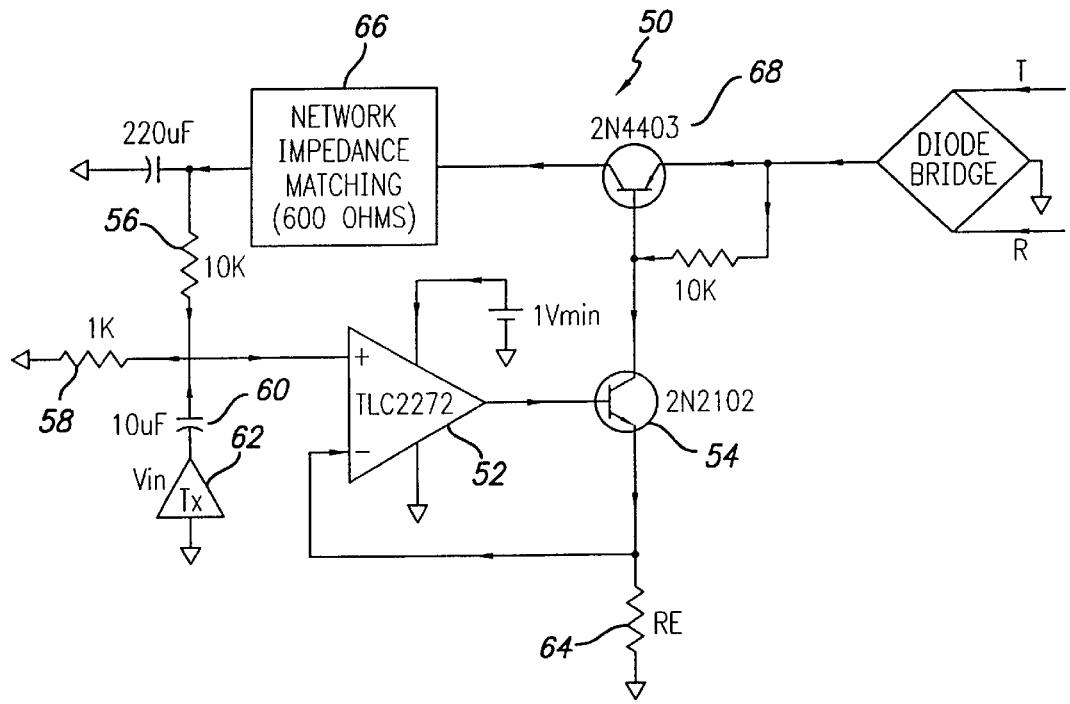
FIG. 3 is a schematic diagram of a first embodiment of the present invention.

A preferred embodiment 50 of the present invention is illustrated in FIG. 3. An operational amplifier 52 drives the base of the electronic inductor transistor 54, and receives negative feedback from the emitter of the transistor 54. The transistor and operational amplifier combine to form a voltage-controlled current source (VCCS) with respect to loop current. A voltage divider 56, 58 connected across the rectified Tip and Ring voltage (or another node of the circuit at an equivalent voltage) provides DC reference to the positive input of the operational amplifier 52, so that the line current automatically increases with an increase in line voltage. A capacitor 60 couples the transmit signal driver 62 to the positive input of the operational amplifier 52. The voltage feedback to the transistor 54 is generally different for the AC and DC signals, which effectively translates to different AC and DC currents through the loop. A second transistor 68 provides increased isolation for the AC modem when the device is on-hook.

The network impedance matching block 66 may be designed as either an RC network, or any other suitable circuitry.

Figure 4:
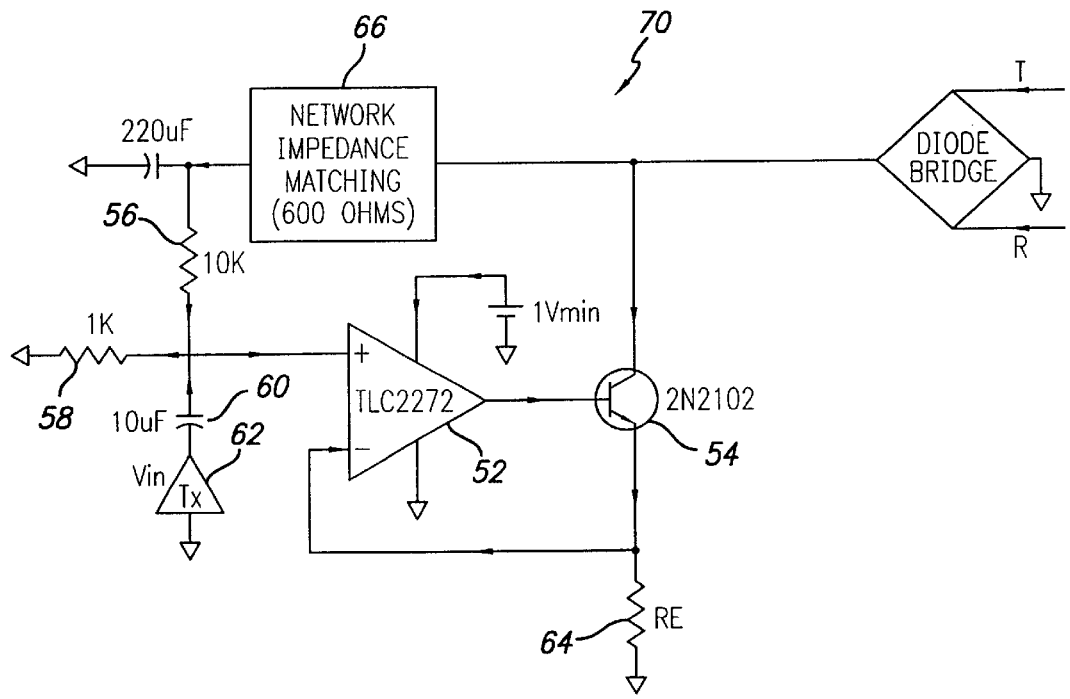
FIG. 4 is a schematic diagram of a second embodiment of the present invention.

A second embodiment 70 of the present invention is illustrated in FIG. 4. This embodiment is similar to the circuit shown in FIG. 3, except that the second transistor 68 is not used because the network impedance matching block 66 is configured as "virtual impedance." The circuit, however, still provides high performance with lower cost.

Figure 5:
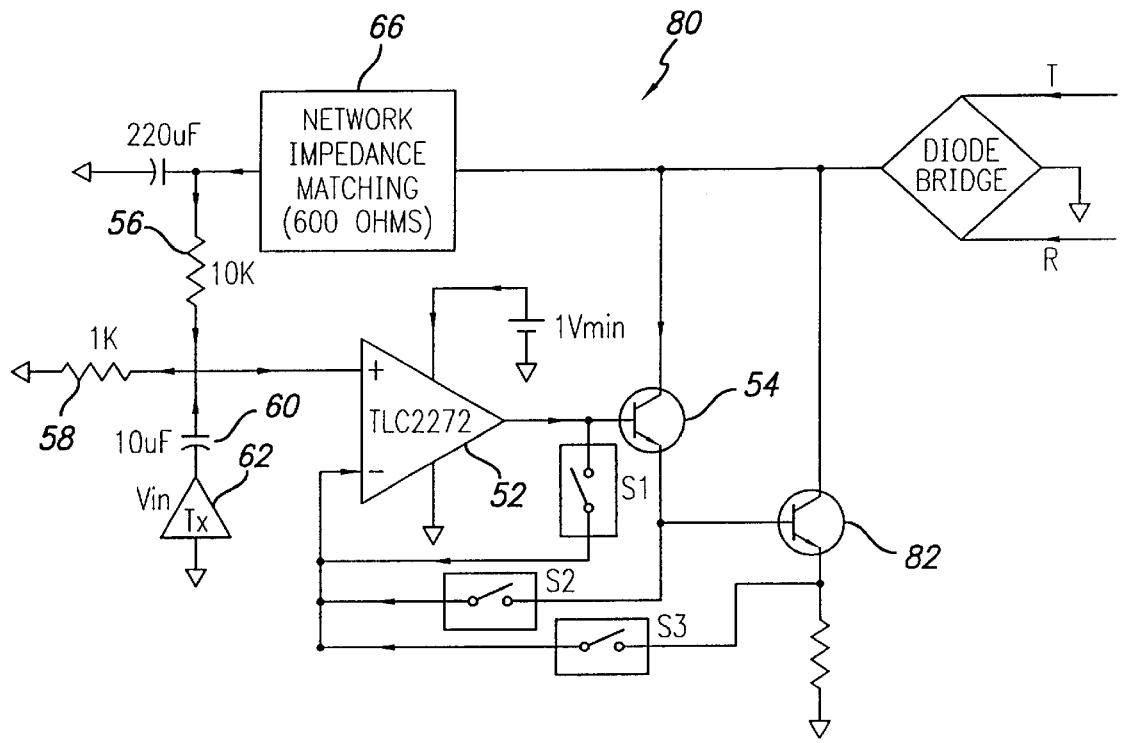
FIG. 5 is a schematic diagram of a third embodiment of the present invention.

A third embodiment of the present invention is shown in FIG. 5. A Darlington configuration 54, 82 is used for the electronic inductor transistor, which provides for multiple feedback points, as selected by closing one of the switches $S_1$, $S_2$, or $S_3$. This configuration provides a convenient platform for intelligent line voltage control, as different feedback points may be selected by external control logic (not shown) in order to properly set the desired DC voltage and current on the line.

Figure 6:
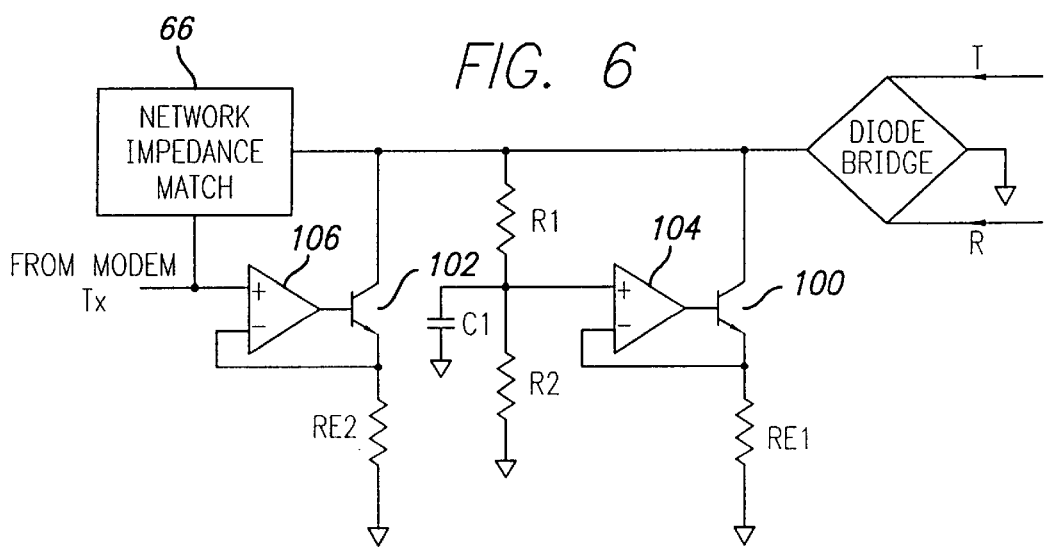
FIG. 6 is a schematic diagram of a fourth embodiment of the present invention.

A fourth embodiment of the present invention is shown in FIG. 6. As previously described herein, the same op-amp/transistor combination may be used to both drive the AC signal and to set the DC loop current. However, a separate op-amp/transistor combination could be used for the AC signal, and one for the DC current, in order to independently control their respective gains and to improve distortion. The first transistor 100 is used as described above to control the DC line current, determined by the resistors R1 and R2. The second transistor 102 controls the AC line current, which includes the virtual impedance feedback and the transmit signal of the modem. The effects of transistors 100 and 102 are independently summed to the line through current ITR and Itr, respectively.

In this configuration, the DC transistor 100 can be biased in a non-linear region at any current without introducing distortion on the AC signal. Conversely, the AC transistor 102 can be biased with a sufficiently low current to operate in a linear region and provide excellent linearity in the AC signal transmitted to the line. Furthermore, this configuration allows the emitter resistors RE1 and RE2, of transistors 100 and 102, to set the gains independently for AC and DC, respectively.

The use of an operational amplifier driver for the electronic inductor transistor, whether the negative input of the op-amp is connected to the emitter of the transistor 100 or simply to the output of the op-amp itself (unity gain buffer), adds a very important benefit. A "hookswitch" is not required in the modem interface circuit to the telephone line.

A hookswitch is generally defined as a switch that physically disconnects the modem circuit components from the telephone line interface, when the modem goes on-hook. Due to the high impedance of the op-amp positive input, resistors R1 and R2 in FIG. 6 can be sufficiently large to provide only a negligible loading effect on the telephone line, when the modem is on-hook. Typically, the on-hook resistance requirement can be met worldwide when the sum of R1 and R2 is greater than 5 Mohms, which is a realistic resistor value. As a result, the electronic inductor in this configuration can be left permanently connected to the telephone line even when on-hook, provided that the base of the transistor is shorted to ground through a switch to prevent current flow through the transistor.

The present circuit configuration has excellent linear characteristics, requires a relatively small output voltage swing in the operational amplifier and in the transmit signal source, and can drive signals on the line as large as 5 volts peak-to-peak with power supplies as low as 1 volt. Because the input impedance of the operational amplifier is large, the transmit signal source does not have to be low-impedance and can be smaller in size and less expensive. Furthermore, this circuit is suitable for line-powered operation as the power supply required to obtain adequate voltage swing on the line can be relatively low.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. A signal driving stage for use in a telephone line interface circuit, the signal driving stage comprising:

an amplifier;

a voltage divider coupled with the amplifier, the voltage divider configured to provide a DC reference to the amplifier; and an inductor transistor coupled with the amplifier such that the amplifier and the inductor transistor form a voltage-controlled current source, the signal driving stage configured to:

drive a linearly varying signal directly onto a telephone line;

set a DC loop current; and block distortion generated in the signal driving stage from effecting the linearly varying signal.

2. The signal driving stage of claim 1, further comprising a pass transistor coupled with the inductor transistor, the pass transistor configured to provide further isolation between the signal driving stage and the telephone line.

3. A signal driving stage for use in a telephone line interface circuit, the signal driving stage comprising:

an amplifier;

a voltage divider coupled with the amplifier, the voltage divider configured to provide a DC reference to the amplifier; and an inductor transistor coupled with the amplifier such that the amplifier and the inductor transistor form a voltage-controlled current source, the signal driving stage configured to:

drive a linearly varying signal directly onto a telephone line;

set a DC loop current;

block distortion generated in the signal driving stage from effecting the linearly varying signal; and provide an on-hook resistance that is large enough to allow the telephone line interface circuit to be connected to the telephone line even when on-hook.

4. The signal driving stage of claim 3, wherein the on-hook resistance comprises the voltage divider.

5. A signal driving stage for use in a telephone line interface circuit, the signal driving stage comprising:

an amplifier;

a voltage divider coupled with the amplifier, the voltage divider configured to provide a DC reference to the amplifier;

an inductor transistor coupled with the amplifier such that the amplifier and the inductor transistor form a voltage-controlled current source; and an emitter resistor coupled between the inductor transistor and a ground, the signal driving stage configured to:
 drive a linearly varying signal onto a telephone line;
 set a DC loop current;
 block distortion generated in the signal driving stage from effecting the linearly varying signal; and
 cause a current in the telephone line to vary linearly in response to a transmit voltage signal, and wherein the current is inversely proportional to a resistance of the emitter resistor.

6. A signal driving stage for use in a telephone line interface circuit, the signal driving stage comprising:

an amplifier;

a voltage divider coupled with the amplifier, the voltage divider configured to provide a DC reference to the amplifier;

an inductor transistor coupled with the amplifier such that the amplifier and the inductor transistor form a voltage-controlled current source;

a Darlington transistor coupled with the inductor transistor; and a plurality of selectable feedback paths configured to provide feedback from the combination of the inductor transistor and the Darlington transistor at different feedback points to the amplifier, the signal driving stage configured to:
 drive a linearly varying signal onto a telephone line;
 set a DC loop current;
 block distortion generated in the signal driving stage from effecting the linearly varying signal; and
 provide intelligent control of the DC operating point and the linearly varying signal through selection of the appropriate feedback path.

7. A modem comprising a telephone line interface circuit, the modem configured to communicate signals over a telephone line, the telephone line interface circuit comprising:

an impedance matching circuit configured to match an impedance of the telephone line interface circuit to an impedance of the telephone line; and a signal driving stage comprising an amplifier, the signal driving stage configured to:
 drive the communication signals directly onto the telephone line;
 set a DC operating voltage without effecting an AC response of the signal driving stage relative to a transmit voltage signal, and
 provide an on-hook resistance that is large enough to allow the line interface circuit to be connected to the telephone line even when on-hook.

8. The modem of claim 7, wherein the telephone line interface circuit further comprises an isolation circuit configured to provide isolation to the modem when the modem is on-hook.

9. The modem of claim 7, wherein the signal driving stage is further configured to provide a variable DC operating voltage.

10. The modem circuit of claim 7, wherein the signal driving stage is further configured to:
 drive a linearly varying signal onto a telephone line;
 set a DC loop current; and
 block distortion generated in the signal driving stage from effecting the linearly varying signal.

11. A modem comprising a telephone line interface circuit, the modem configured to communicate signals over a telephone line, the telephone line interface circuit comprising:

an impedance matching circuit configured to match an impedance of the telephone line interface circuit to an impedance of the telephone line; and a signal driving stage comprising an amplifier, the signal driving stage configured to:
 set a DC operating voltage without effecting an AC response of the signal driving stage relative to a transmit voltage signal,
 provide an on-hook resistance that is large enough to allow the line interface circuit to be connected to the telephone line even when on-hook, and
 provide intelligent control of the DC operating voltage.

* * * * *